(12) United States Patent
Chun

(10) Patent No.: US 9,758,889 B2
(45) Date of Patent: Sep. 12, 2017

(54) METHOD FOR PRODUCING SUBSTRATE FORMED WITH COPPER THIN LAYER, METHOD FOR MANUFACTURING PRINTED CIRCUIT BOARD AND PRINTED CIRCUIT BOARD MANUFACTURED THEREBY

(71) Applicant: YMT CO., LTD., Incheon (KR)

(72) Inventor: Sung Wook Chun, Incheon (KR)

(73) Assignee: YMT CO., LTD., Incheon (KR)

( * ) Notice: Subject to any disclaimer, the term of this patent is extended or adjusted under 35 U.S.C. 154(b) by 325 days.

(21) Appl. No.: 14/273,541

(22) Filed: May 8, 2014

(65) Prior Publication Data

US 2015/0327364 A1    Nov. 12, 2015

(51) Int. Cl.
| | | |
|---|---|---|
| *C25D 5/02* | (2006.01) |
| *B32B 15/01* | (2006.01) |
| *H05K 1/03* | (2006.01) |
| *H05K 1/09* | (2006.01) |
| *H05K 3/06* | (2006.01) |
| *H05K 3/18* | (2006.01) |
| *H05K 3/02* | (2006.01) |

(52) U.S. Cl.
CPC ............. *C25D 5/02* (2013.01); *B32B 15/017* (2013.01); *C25D 5/022* (2013.01); *H05K 1/03* (2013.01); *H05K 1/09* (2013.01); *H05K 3/025* (2013.01); *H05K 3/062* (2013.01); *H05K 3/188* (2013.01); *H05K 2203/0152* (2013.01); *Y10T 428/12479* (2015.01); *Y10T 428/24917* (2015.01)

(58) Field of Classification Search
CPC ................................ B32B 15/01; H05K 3/025
USPC .......................................................... 205/125
See application file for complete search history.

(56) References Cited

U.S. PATENT DOCUMENTS

| | | | | |
|---|---|---|---|---|
| 3,969,199 A | * | 7/1976 | Berdan ..................... | C25D 1/04 205/177 |
| 5,322,975 A | * | 6/1994 | Nagy ..................... | H05K 3/025 156/289 |
| 6,183,880 B1 | * | 2/2001 | Yoshioka ................. | C25D 1/04 148/264 |
| 2006/0019486 A1 | * | 1/2006 | Yu ..................... | H01L 21/76829 438/628 |
| 2009/0250352 A1 | * | 10/2009 | Dubin ..................... | C25D 3/38 205/143 |
| 2010/0025091 A1 | * | 2/2010 | Ferdinandi ............. | H05K 3/282 174/257 |
| 2010/0309707 A1 | | 12/2010 | McCarthy et al. | |

FOREIGN PATENT DOCUMENTS

| | | |
|---|---|---|
| JP | 2006-306086 A | 11/2006 |
| JP | 4824828 | 11/2011 |
| KR | 10-2012-0084441 A | 7/2012 |
| TW | 200844778 | 11/2008 |
| TW | 201247042 | 11/2012 |
| WO | 0224444 | 3/2002 |

* cited by examiner

*Primary Examiner* — Humera Sheikh
*Assistant Examiner* — Lucas Wang
(74) *Attorney, Agent, or Firm* — STIP Law Group, LLC

(57) ABSTRACT

One embodiment of the present disclosure provides a method for producing a substrate formed with a copper thin layer. The method includes providing a carrier, forming a separation-inducing layer on the surface of the carrier, forming a copper thin layer on the separation-inducing layer, and bonding a core to the copper thin layer.

7 Claims, 3 Drawing Sheets

METHOD FOR PRODUCING SUBSTRATE FORMED WITH COPPER THIN LAYER, METHOD FOR MANUFACTURING PRINTED CIRCUIT BOARD AND PRINTED CIRCUIT BOARD MANUFACTURED THEREBY

FIELD OF THE DISCLOSURE

The present disclosure relates to a method for producing a substrate formed with a copper thin layer and a method for manufacturing a printed circuit board. More specifically, the present disclosure relates to a method for producing a substrate formed with a copper thin layer that is suitable for the manufacture of a printed circuit board having a fine pattern circuit, and a method for manufacturing a printed circuit board.

BACKGROUND

A printed circuit board (PCB) is means that fixes and electrically connects various electronic components to construct a circuit. Generally, the printed circuit board includes an insulating base, a conductive pattern on the insulating base, and a plurality of through-holes through which components are fixed and electrically connected to each other.

Printed circuit boards can be classified into rigid printed circuit boards (rigid PCBs), flexible printed circuit boards (FPCBs), and rigid-flexible printed circuit boards (R-F PCBs). In the rigid PCBs, a copper foil is attached to a core material obtained by reinforcing an epoxy resin with a suitable material such as a glass fiber. In the flexible PCBs, a copper foil is attached to polyimide. The R-F PCBs are combinations of rigid PCBs and flexible PCBs to possess the advantages of the two PCBs. The application of these printed circuit boards is determined depending on their characteristics. With the recent trend toward lightweight, slim and small-sized electronic devices, there has been an increasing demand for printed circuit boards taking up a little space. Miniaturization of printed circuit boards requires lamination of circuit patterns or a reduction in spacing between the interconnections of circuits.

According to a traditional method for forming a circuit pattern in a printed circuit board, a dry film is used to form a masking pattern on a copper foil, and the copper foil is etched to form a circuit. This method has a limitation in controlling the spacing between the circuit interconnections to 60 micrometers or less. In attempts to overcome the limitation encountered with the formation of fine circuit patterns, new techniques, for example, a semi-additive process (SAP), have recently been introduced. The semi-additive process is a concept opposite to traditional etching processes. According to the semi-additive process, an area other than an area for circuit formation is masked with a suitable masking material such as a dry film, followed by direct plating on the area for circuit formation to form a conductive pattern.

Even when the semi-additive process is applied, the use of a thin copper foil is required for the formation of a fine pattern. The copper foil is a base layer serving as an electrode for direct plating. However, thin copper foils are available from only a few suppliers because they are difficult to produce. Due to high price of thin copper foils, PCB manufacturers purchase cheap thick copper foils and etch them to desired thicknesses before use. However, the additional etching involves an additional increase in production cost and causes environmental pollution problems.

Many production processes of copper foils for printed circuit boards are widely known. For example, Korean Patent Publication No. 2012-0084441 discloses a copper foil for the production of a copper clad laminate and a copper clad laminate including the copper foil. However, when a copper foil is laminated on a carrier, diffusion occurs between the carrier aluminum and the copper. This diffusion makes it difficult to peel off the aluminum carrier layer, and as a result, a uniform surface of the copper foil is difficult to obtain. Further, Korean Patent Registration No. 728764 introduces a technique associated with the deposition of copper particles by sputtering. This technique contributes to simplification of the production procedure, improvement of production efficiency, and slimness of a substrate. This patent publication, however, does not disclose the production of a thin copper foil.

SUMMARY

A first object to be achieved by one embodiment of the present disclosure is to provide a method for producing a substrate formed with a copper thin layer that can prevent diffusion at the interface between a carrier and the copper thin layer, facilitating separation between the carrier and the copper thin layer.

A second object to be achieved by one embodiment of the present disclosure is to provide a method for manufacturing a printed circuit board that uses the method for producing a substrate formed with a copper thin layer.

A third object to be achieved by one embodiment of the present disclosure is to provide a printed circuit board manufactured by the manufacturing method.

A fourth object to be achieved by one embodiment of the present disclosure is to provide a substrate formed with a copper thin layer that is produced by the production method.

According to one embodiment of the present disclosure, the first object is achieved by the provision of a method for producing a substrate formed with a copper thin layer, the method including providing a carrier, forming a separation-inducing layer on the surface of the carrier, forming a copper thin layer on the separation-inducing layer, and bonding a core to the copper thin layer.

According to one exemplary embodiment of the present disclosure, the carrier may be made of aluminum, and the separation-inducing layer may be formed by forming a porous layer on the carrier surface and applying a sealing agent to the surface of the carrier formed with the porous layer.

According to a further exemplary embodiment of the present disclosure, the porous layer may be formed on the carrier surface using a solution including at least one compound selected from the group consisting of alkali compounds, iron compounds, and carbonate compounds.

According to another exemplary embodiment of the present disclosure, the porous layer may be formed on the carrier surface by electroless etching.

According to another exemplary embodiment of the present disclosure, the porous layer formed on the carrier surface may be formed using aluminum.

According to another exemplary embodiment of the present disclosure, the sealing agent applied to the surface of the carrier formed with the porous layer may include at least one material selected from the group consisting of metal-polymer composites, cobalt-chromium, boron nitride, molybdenum disulfide, and polytetrafluoroethylene.

According to one embodiment of the present disclosure, the second object is achieved by the provision of a method for manufacturing a printed circuit board, the method including: providing a substrate formed with a copper thin layer produced by the production method; separating the carrier and the separation-inducing layer from the substrate, forming a mask for pattern formation on the copper thin layer, and forming a copper pattern on the copper thin layer by electroplating; removing the mask for pattern formation; and removing the copper thin layer to leave a patterned copper circuit.

According to one embodiment of the present disclosure, the third object is achieved by the provision of a printed circuit board manufactured by the manufacturing method.

According to one embodiment of the present disclosure, the fourth object is achieved by the provision of a substrate including a carrier made of aluminum, a separation-inducing layer formed on the carrier surface, a copper thin layer formed on the separation-inducing layer, and a core bonded to the copper thin layer wherein the separation-inducing layer consists of a porous aluminum layer and a sealing layer formed on the porous aluminum layer.

The production method and the manufacturing method according to the embodiments of the present disclosure have the following advantageous effects.

First, the presence of the separation-inducing layer between the carrier layer and the copper thin layer prevents diffusion between the carrier layer and the copper plating layer in the course of attaching the core to the copper foil by thermal pressing. Therefore, the carrier can be easily separated from the copper thin layer and the thickness and surface roughness of the separated copper thin layer can be maintained constant.

Second, the formation of the separation-inducing layer includes forming the porous layer on the surface of the carrier made of aluminum, and the porous layer is formed using aluminum, not aluminum oxide. Therefore, the carrier can be removed by chemical etching using a single etching solution.

Third, the copper thin layer of the substrate produced in accordance with the embodiment of the present disclosure can be formed so as to have a sufficiently small thickness. Therefore, when a semi-additive process is applied, the underlying copper thin layer to be etched is thin, thus being advantageous for the formation of a fine circuit pattern.

BRIEF DESCRIPTION OF THE DRAWINGS

The above and other embodiments and advantages of the disclosure will become apparent and more readily appreciated from the following description of the embodiments, taken in conjunction with the accompanying drawings of which.

DETAILED DESCRIPTION

Figure 1:
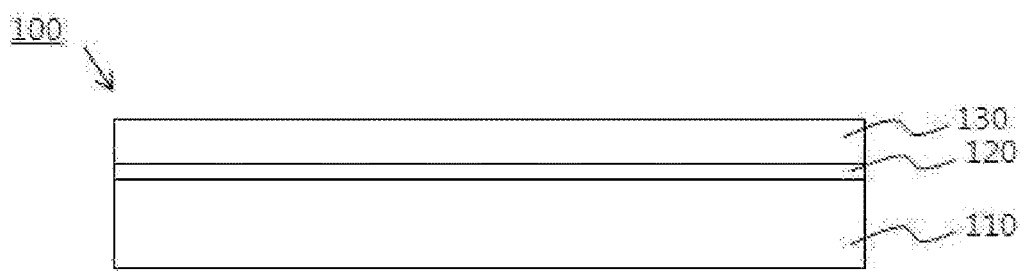
FIG. 1 is a cross-sectional view illustrating the structure of a general printed circuit board.

One embodiment of the present disclosure provides a method for producing a substrate formed with a copper thin layer, the method including providing a carrier, forming a separation-inducing layer on the surface of the carrier, forming a copper thin layer on the separation-inducing layer, and bonding a core to the copper thin layer.

Embodiments of the present disclosure will now be described in more detail with reference to the accompanying drawings. These embodiments are provided so that this disclosure will fully convey the scope of the disclosure to those skilled in the art. Accordingly, the present disclosure may be embodied in many different forms and should not be construed as limited to the exemplary embodiments set forth herein. In the drawings, the dimensions, such as widths, lengths and thicknesses, of elements may be exaggerated for clarity. It will be understood that when an element is referred to as being "on" another element, it can be directly on the other element, or one or more intervening elements may also be present therebetween. Further, in the case of a method including one or more sequential steps, one or more other steps may intervene between the sequential steps. If needed, the steps may not be limited to this sequence and may be practiced in other orders.

FIG. 1 is a cross-sectional view illustrating the structure of a general printed circuit board. Referring to FIG. 1, the printed circuit board 100 includes a core 110, an adhesion layer 120, and a copper thin layer 130. The core 110 may be made of a rigid or flexible material. The core 110 made of a rigid material is used to manufacture a rigid printed circuit board and the core 110 made of a flexible material is used to manufacture a flexible printed circuit board. For example, the rigid material may be metal, glass or a composite of an epoxy resin and a glass fiber, and the flexible material may be a polyimide resin. The adhesion layer functions to bond the core and the copper thin layer, and the copper thin layer may be patterned to construct a circuit.

There are many methods for the construction of circuits using copper thin layers in printed circuit boards. According to the embodiment of the present disclosure, a copper thin layer can be formed so as to have a sufficiently small and uniform thickness, thus facilitating the formation of a fine pattern circuit by a semi-additive process.

Figure 2:
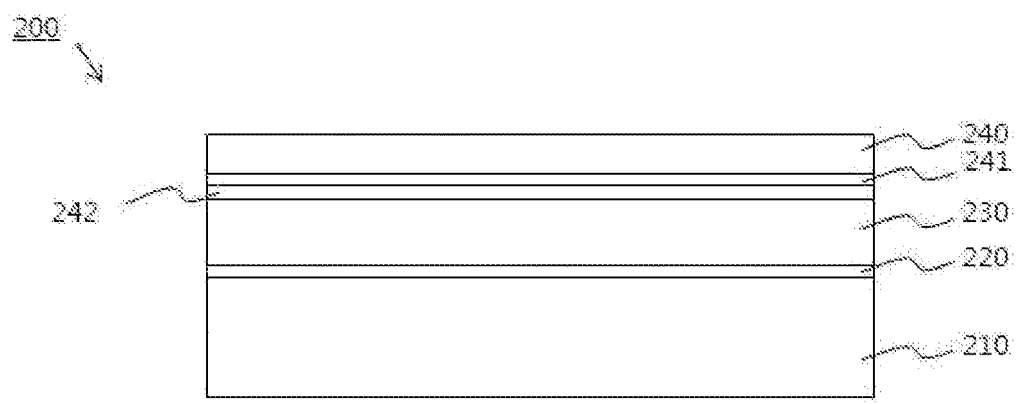
FIG. 2 is a cross-sectional view illustrating the structure of a substrate formed with a copper thin layer produced in accordance with one embodiment of the present disclosure.

FIG. 2 is a cross-sectional view illustrating the structure of a substrate formed with a copper thin layer produced in accordance with the embodiment of the present disclosure. Referring to FIG. 2, the substrate 200 includes a core 210, an adhesion layer 220, a copper thin layer 230, a sealing layer 242, a porous layer 241, and a carrier 240. The core 210 is a base of a printed circuit board and may be made of a rigid material or flexible material. For example, the rigid material may be metal, glass or an epoxy/glass fiber composite and the flexible material may be a polyimide resin. The core 210 may be a structure for printed circuit board such as metal, glass or a composite of an epoxy resin and a glass fiber, or a polymer film such as PET or PEN. The core may be used suitable for the application. Although not illustrated in the figure, the substrate 200 may optionally further include a thermoplastic resin layer on the surface of the core 210 where the adhesion layer 220 is to be formed. The adhesion layer functions to bond the copper thin layer 230 and the core 210. Various kinds of polymer resin adhesives may be used as materials for the adhesion layer 220. When the core is made of polyimide, the adhesion layer 220 may be formed using an adhesive that is highly compatible with the polyimide. The copper thin layer 230 constitutes a circuit pattern of a printed circuit board. The circuit pattern may be formed by an etching or semi-additive process. When a semi-additive process is applied, another copper thin layer having a predetermined pattern may be formed on the copper thin layer 230. The carrier 240 is bonded to the copper thin layer 230. A separation-inducing layer including the porous layer 241 and the sealing layer 242 may be formed between the copper thin layer 230 and the carrier 240. The separation-inducing layer functions to prevent interdiffusion between a metal component of the carrier and copper of the copper thin layer in the course of bonding the copper thin layer and the core by thermal pressing, facilitating separation between the carrier and the copper thin layer in the subsequent processing step while maintaining the thickness and surface roughness of the copper thin layer constant.

Hereinafter, the method for producing a substrate formed with a copper thin layer according to the embodiment of the present disclosure is explained based on the individual steps.

First, a carrier is provided. An aluminum sheet may be used as the carrier. A release paper may be attached to one side of the carrier through a pressure-sensitive adhesive.

Subsequently, a porous layer is formed on at least one side of the carrier. The porous layer is formed by treating an aluminum sheet with a solution including an alkali compound, an iron compound or a carbonate compound as a major component and at least one functional additive. For example, the alkali compound may be sodium hydroxide (NaOH) or potassium hydroxide (KOH), the iron compound may be iron cyanide or iron citrate, the carbonate compound may be potassium carbonate or sodium carbonate, and the functional additive may be a chelating agent. That is, the step of forming the porous layer is carried out by treating the surface of aluminum with a chemical without the need to use electricity, unlike an anodizing process using electricity. This chemical treatment, together with microetching, is a concept for the formation of pores on the aluminum surface. The electroless chemical treatment may be a process for etching the surface of aluminum to form the porous layer. Specifically, this process may be carried out by dipping the aluminum carrier in the chemical at about 40 to about 60° C. for about 3 to about 10 minutes. Generally, anodizing using electricity forms a non-conducting layer. In contrast, the porous layer formed by the chemical treatment has a structure in which only pores are formed in the base material. Due to this structure, the properties of the base material as a conductor remain unchanged, and as a result, the current-carrying properties of the porous layer are not affected by the chemical treatment. Since the major component of the porous layer is not aluminum oxide but aluminum, the carrier can be separated and removed from a copper thin layer by a chemical process using only an etching solution for aluminum removal. Small amounts of other components such as aluminum hydroxide may remain in the porous layer. However, since these components are small in thickness, they can be separated and removed by the etching solution during aluminum etching.

Subsequently, a sealing layer is formed on the porous layer. This step is optional. The sealing layer functions as a lubricant to facilitate separation between the carrier and a copper thin layer, which is to be formed on the sealing layer. The sealing layer filled in the pores of the porous layer functions to make the surface of the copper thin layer smooth while preventing the formation of a kind of alloy layer as a result of diffusion between aluminum of the carrier and copper of the copper thin layer in the course of bonding a core to the copper thin layer by thermal pressing. The sealing layer may be formed using an inorganic or organic material or a polymer resin. Examples of suitable materials for the sealing layer include boron nitride (BN), molybdenum disulfide ($MoS_2$), Teflon, and polytetrafluoroethylene (PTFE). A metal layer such as a cobalt-chromium layer may also be used as the sealing layer. Alternatively, a metal-polymer composite may be used to form the sealing layer. In this case, the metal compound of the composite may be, for example, nickel acetate, nickel carbonate, nickel fluoride, nickel sulfate or $CrF_3.3H_2O$, and the polymer of the composite may be, for example, urethane, polyvinyl acetate (PVAC), polyethylene glycol (PEG) or Nylon 6 (NA6). Although FIG. 2 illustrates sequential lamination of the porous layer and the sealing layer distinguished from each other, the constituent material of the sealing layer may be filled in the pores of the porous layer. The porous layer and the sealing layer form a separation-inducing layer. The porous layer is a porous aluminum layer and the sealing layer is coated on the porous layer. That is, the separation-inducing layer has a structure in which the sealing layer is formed on the porous aluminum layer.

The separation-inducing layer consisting of the porous layer and the sealing layer is formed between the carrier and the copper thin layer. The absence of the separation-inducing layer causes diffusion at the interface between the carrier and the copper thin layer in the course of thermally pressing the copper thin layer and a core at a high temperature of 350° C. or more. This diffusion makes separation between the carrier and the copper thin layer difficult. Meanwhile, the presence of the separation-inducing layer between the carrier and the copper thin layer prevents aluminum of the carrier and copper of the copper thin layer from forming a diffusion layer at a high temperature, and enables separation of the aluminum carrier from the copper thin layer by chemical etching using only an aluminum etching solution without using an aluminum oxide etching solution, simplifying the production procedure and lowering the production cost.

Subsequently, a copper thin layer is formed on the sealing layer. The copper thin layer may be formed by electroless copper plating. The formation of the copper thin layer by electroless copper plating is based on a chemical reaction mechanism without using electricity. The copper thin layer may be plated to a uniform thickness of submicrometer to several tens of micrometers. Thus, depending on the thickness of the copper thin layer, a circuit pattern may be formed by an etching or semi-additive process. The electroless copper plating may be suitably selected from displacement copper plating based on a difference in ionization tendency and electroless reduction copper plating based on the function of a reducing agent used according to the intended application.

Subsequently, a core is bonded to the copper thin layer. For this bonding, an adhesion layer or primer layer may be formed between the core and the copper thin layer. The adhesion layer or primer layer may be formed using a material that is highly compatible with a polymeric material for the core. Examples of suitable polymeric materials for the core include polyethylene teraphthalate (PET), polyimide, and flexible epoxy. Alternatively, the adhesion layer or primer layer may be formed using an organotitanium or organosilane compound. A mixture including a resin as a major component may also be used. The adhesion layer or primer layer can function as an anti-rusting layer capable of preventing oxidation of the copper thin layer, in addition to the inherent function of bonding with the core material. For better adhesion function of the primer layer, the attachment of an adhesive tape as well as the application of a primer is possible.

The substrate produced in accordance with the embodiment of the present disclosure can be used as a material for a printed circuit board, more specifically, for the manufacture of a multilayer printed circuit board. An explanation will be sequentially given concerning a method for manufacturing a multilayer printed circuit board according to the prior art and a method for manufacturing a multilayer printed circuit board according to one embodiment of the present disclosure.

Figure 3:
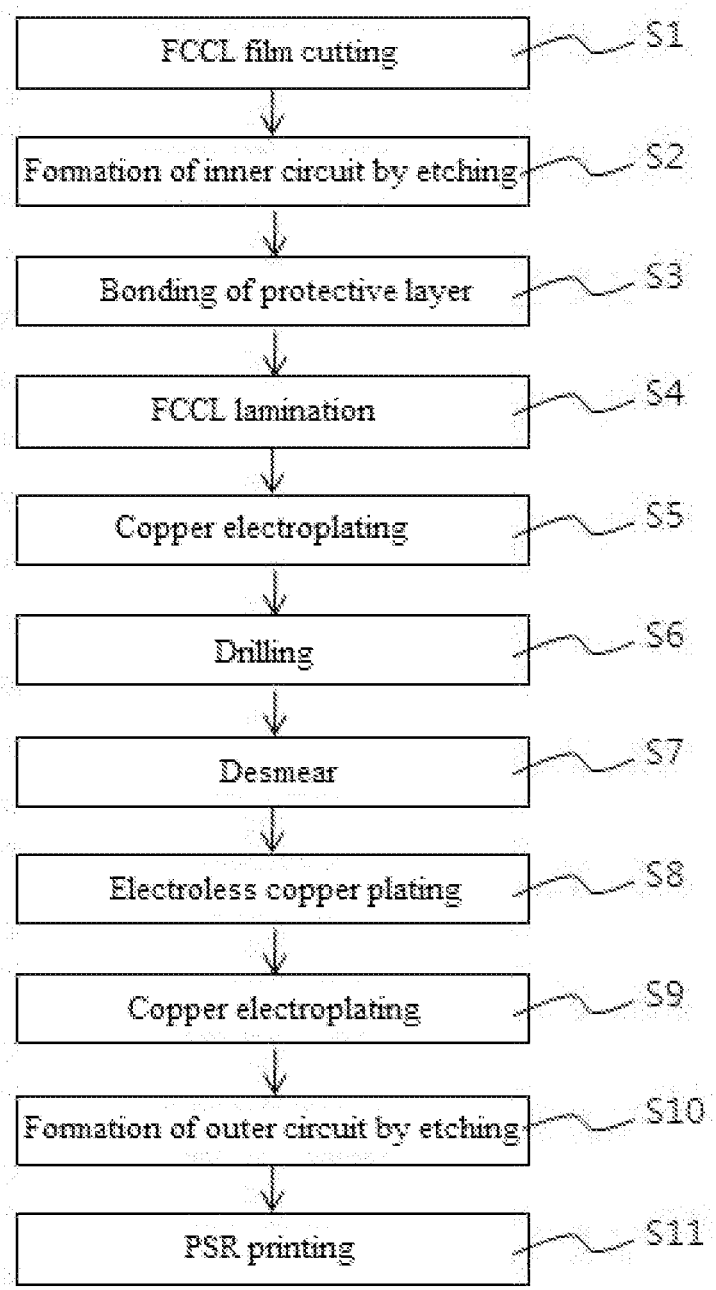
FIG. 3 is a flow chart for explaining a method for manufacturing a multilayer printed circuit board of the prior art.

FIG. 3 is a flow chart for explaining a method for manufacturing a multilayer printed circuit board according to the prior art. Referring to FIG. 3, a flexible copper clad laminate (FCCL) is cut to a predetermined size (S1). In the flexible copper clad laminate, a copper thin film is bonded to a polyimide core. Subsequently, the cut flexible copper clad laminate film is etched to form an inner circuit thereon (S2), and then a protective layer is bonded thereto (S3). Subsequently, another flexible copper clad laminate is laminated on the protective layer through a bonding sheet (S4). Subsequently, copper electroplating is performed on the laminated flexible copper clad laminate to form a copper plating layer (S5), and then the copper plating layer is drilled to form a plurality of through-holes (S6). Subsequently, residues such as chips remaining on the inner walls of the through-holes after processing are removed by a desmear process (S7). Subsequently, electroless copper plating and copper electroplating are sequentially performed to form a copper plating layer (S8 and S9). Subsequently, etching is performed on the copper plating layer to form an outer circuit (S10), and then a printing process is performed on the outer circuit to form a PSR printing layer (S11).

According to the conventional manufacturing method, the use of the copper clad laminates including complex, expensive copper thin films causes a rise in cost, and the complicated lamination procedure and the increased use of subsidiary materials increase the thickness of the multilayer printed circuit board. In contrast, the use of the substrate according to the present disclosure is effective in manufacturing a multilayer printed circuit board in a simple and economical manner. A detailed explanation will be given concerning a method for manufacturing a multilayer printed circuit board according to the present disclosure.

Figure 4:
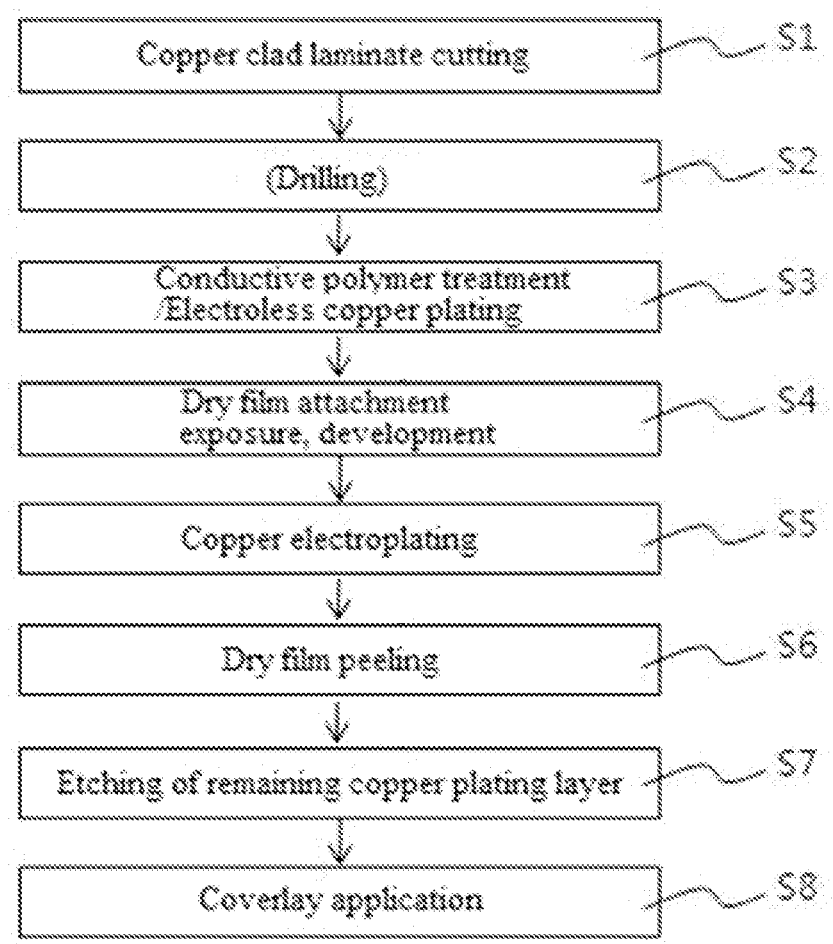
FIG. 4 is a flow chart for explaining a method for manufacturing a printed circuit board according to one embodiment of the present disclosure.

FIG. 4 is a flow chart for explaining a method for manufacturing a printed circuit board according to one embodiment of the present disclosure. Referring to FIG. 4, first, the substrate produced by the method explained with reference to FIG. 2 is used as a flexible copper clad laminate (FCCL) and is cut to a desired size (S1). Subsequently, the cut substrate is optionally drilled to form a plurality of through-holes (S2). Subsequently, the inner walls of the through-holes are treated with a conductive polymer or are subjected to electroless copper plating. The conductive polymer treatment or electroless copper plating is a pretreatment process for plating (S3). Subsequently, a dry film is laminated on the substrate, exposed to light to form a positive image, and developed (S4). Subsequently, the pretreated substrate is subjected to copper electroplating to form a copper plating layer (S5). Subsequently, the dry film remaining after circuit formation by copper plating is peeled off (S6). Subsequently, the thin copper thin layer remaining on a portion of the underlying layer from which the dry film has been peeled off is etched (S7). Subsequently, a coverlay is applied to the portion other than the exposed circuit (S8).

According to the method for manufacturing a printed circuit board using the substrate produced in accordance with the embodiment of the present disclosure, only a portion for circuit formation is exposed and filled with a plating material to form a circuit. In contrast, according to the conventional manufacturing method, the entire area of a panel is plated with copper, and a portion other than an area for circuit formation is etched. Therefore, the manufacturing method according to the embodiment of the present disclosure is very economical and is suitable for fine circuit formation. Particularly, with the recent trend of technological advance, there is an increasing demand for fine circuits, which have been difficult to achieve by conventional etching processes. Under these circumstances, it is essential to develop a semi-additive process for filling a circuit portion with a plating material.

Hereinafter, the manufacturing method according to the embodiment of the present disclosure explained with reference to FIG. 4 is described in more detail based on the use of a polyimide core. First, a copper clad laminate using the substrate produced in accordance with the embodiment of the present disclosure is cut to a desired size. Subsequently, the cut copper clad laminate is optionally processed to form holes. Circuits formed at both sides of the substrate are in electrical communication with each other through the holes. The holes are generally formed by mechanical processing using a CNC drill or laser drill. Alternatively, the holes may be formed by chemical processing using a polyimide etchant. The aluminum carrier used in accordance with the embodiment of the present disclosure is advantageous as an entry board that increases the positional precision of the holes and functions to radiate heat during processing using a drill. This hole processing may also be omitted. After the drill processing, the aluminum carrier is separated from the copper thin layer. A physical or chemical method may be used to separate the aluminum carrier and the copper thin layer. Aluminum and copper are dissimilar metals and are thus easy to separate. Accordingly, a physical method can be generally used to separate the aluminum carrier and the copper thin layer. In the case where polyimide as a material for the core is bonded to the copper thin layer at a high temperature of about 350° C. or more, diffusion occurs between the carrier aluminum and the copper thin layer, making uniform peeling between them difficult. In this case, a method using a suitable chemical such as sodium hydroxide is required to remove only the aluminum. According to the present disclosure, since the porous layer is formed on the surface of the aluminum carrier, the thickness of natural aluminum oxide or aluminum hydroxide is negligible. Accordingly, the aluminum carrier can be advantageously removed using only an aluminum etching solution. Subsequently, the resulting structure is treated with a conductive polymer or is subjected to electroless copper plating. This treatment or plating is a process for forming conductive layers on the inner walls of the holes to allow electricity to flow through the holes. The reason for the formation of the conductive layers is because non-conducting polyimide constitutes the inner walls of the hole-processed portions of the copper foil laminate from which the aluminum carrier has been removed. Other processes such as black hole and shadow processes using carbon particles may also be applied instead of the treatment with a conductive polymer or electroless copper plating. Chemical copper plating or direct copper electroplating may be further performed on the conductive layers after the conductive polymer treatment or electroless copper plating. Subsequently, a dry film is attached to the substrate processed for conductivity, exposed to light to form a positive image, and developed. Subsequently, the exposed portion for circuit formation is plated with copper to form a circuit, and then the remaining dry film is peeled off Subsequently, the thin copper foil remaining on a portion of the underlying layer is etched. Subsequently, a coverlay is applied to the portion other than the circuit, completing the manufacture of a printed circuit board.

The present disclosure will be explained in more detail with reference to the following examples.

EXAMPLES (1) Aluminum Carrier Surface Degreasing (Cleaning and Porous Layer Formation)

An aluminum carrier was degreased with a dilution of a degreasing agent (Al clean 193, YMT) at a temperature of 30-50° C. for 2-5 min to remove contaminants such as organic materials from the surface thereof. As a result, the surface of the aluminum carrier was partially etched to form a porous layer.

(2) Chromium-Polymer Layer (Sealing Layer) Formation

A thin chromium (Cr)-polymer film was formed on the degreased aluminum (on the porous layer). The formation of the chromium-polymer film facilitated separation between a copper plating layer and the underlying aluminum layer. The chromium-polymer layer was post-treated by dipping in an acidic aqueous solution at 50-70° C. for 10-15 min. The acidic aqueous solution was prepared by mixing $CrF_3.3H_2O$ and polyethylene glycol (PEG, alcohol-based polymer) in amounts such that the chromium content was 1 wt % or less.

(3) Copper Plating

Electroless copper plating was performed on the chromium-polymer layer at 30-50° C. for 5-15 min. The thickness of the copper plating layer was adjusted by increasing or decreasing the plating time.

(4) Resin Coating (Adhesion Layer Formation)

The copper-plated aluminum carrier was used to manufacture a copper clad laminate. To this end, a resin was coated to a thickness of about 7-9 μm on the surface of the copper plating layer. A polyethylene (PE) or epoxy resin was used as the resin depending on a base to be laminated in the subsequent step. The resin-coated structure was dried in an oven at a temperature of 80-100° C. for at least 5 min to remove solvents present in the resin.

(5) Lamination (Core Bonding)

The resin-coated structure was laminated on an underlying base such as PET, PEN, PI or Pre-preg depending on its intended application. A roll-to-roll process was used when the base was a flexible material and a hot-press process was used when the base was rigid.

(6) Aluminum Carrier Removal

The unnecessary aluminum carrier was removed from the laminated structure. The peel strength of the carrier was not higher than 100 gf/cm due to the presence of the release layer formed in (2).

Evaluation Examples

The peel strength between the carrier and the copper thin layer was measured by 90° peel test.

A comparative product having no separation-inducing layer showed a peel strength of about 300 gf/cm, and a product having a separation-inducing layer formed after treatment at about 30° C. for 3 min was found to have a peel strength of about 100 gf/cm or less between the copper thin layer and the carrier. These results reveal that the presence of the separation-inducing layer facilitated peeling between the copper thin layer and the carrier after transfer of the copper thin layer.

There was a difference in peel strength between the copper thin layer and the carrier depending on the surface roughness of the carrier. When the carrier was etched by about 0.1 μm using an etching solution of an alkali component, a surface roughness (Ra) of about 1.5-2.0 was obtained. When the carrier was finely etched by about 0.1 μm was using an etching solution containing a corrosion inhibitor as a functional additive, a surface roughness (Ra) of about 0.4-0.5 was obtained.

The surface roughness of the aluminum carrier was decreased with decreasing thickness. Accordingly, electroless copper plating reduced the peel strength between the carrier and the copper thin layer from about 300 gf/cm to about 200 gf/cm, resulting in easier peeling therebetween.

Although the technical spirit of the present disclosure has been described with reference to the foregoing embodiments, those skilled in the art will appreciate that various variations and modifications are possible without departing from the essential features of the present disclosure. Therefore, the embodiments are merely illustrative and are not to be considered as limiting the technical spirit of the present disclosure. The scope of the disclosure is defined by the appended claims and all technical spirit within the range of equivalency of the claims should be construed as falling within the scope of the disclosure.

What is claimed is:

1. A method for producing a substrate formed with a copper thin layer, the method comprising:
   providing a carrier;
   forming a separation-inducing layer on the surface of the carrier;
   forming the copper thin layer on the separation-inducing layer; and
   bonding a core to the copper thin layer,
   wherein the carrier is made of aluminum, and the separation-inducing layer is formed by forming a porous layer comprising aluminum from the surface of the carrier and applying a sealing agent to the porous layer.

2. The method according to claim 1, wherein the porous layer is formed on the carrier surface from the surface of the carrier using a solution comprising at least one compound selected from the group consisting of alkali compounds, iron compounds, and carbonate compounds.

3. The method according to claim 1, wherein the porous layer is formed on the carrier surface from the surface of the carrier by electroless etching.

4. The method according to claim 1, wherein the sealing agent applied to the surface of the carrier formed with the porous layer comprises at least one material selected from the group consisting of cobalt-chromium, metal-polymer composites, boron nitride, molybdenum disulfide, and polytetrafluoroethylene.

5. A method for manufacturing a printed circuit board, the method comprising:
   providing a substrate formed with a copper thin layer produced by the method according to claim 1;
   separating the carrier on the separation-inducing layer from the copper thin layer of the substrate by chemical etching;
   forming a mask for pattern formation on the copper thin layer, and
   forming a copper pattern on the copper thin layer by electroplating;
   removing the mask for pattern formation; and
   removing the copper thin layer to leave a patterned copper circuit.

6. The method according to claim 1, further comprising separating the carrier on the separation-inducing layer from the copper thin layer of the substrate by chemical etching.

7. The method according to claim 6, wherein the step of bonding the core to the copper thin layer is performed by thermal pressing.

* * * * *